(12) United States Patent
Lim et al.

(10) Patent No.: US 8,227,308 B2
(45) Date of Patent: Jul. 24, 2012

(54) METHOD OF FABRICATING SEMICONDUCTOR INTEGRATED CIRCUIT DEVICE

(75) Inventors: Ha-Jin Lim, Seoul (KR); Dong-Suk Shin, Yongin-si (KR); Pan-Kwi Park, Suwon-si (KR); Jun-Jung Kim, Hwaseong-si (KR); Tae-Gyun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 324 days.

(21) Appl. No.: 12/647,806

(22) Filed: Dec. 28, 2009

(65) Prior Publication Data

US 2010/0167533 A1      Jul. 1, 2010

(30) Foreign Application Priority Data

Dec. 26, 2008   (KR) .................. 10-2008-0134730

(51) Int. Cl.
*H01L 21/8238* (2006.01)
(52) U.S. Cl. ................... 438/199; 257/E21.632
(58) Field of Classification Search .................. 438/199, 438/791, 308, 795; 257/E21.632
See application file for complete search history.

(56) References Cited

U.S. PATENT DOCUMENTS

| | | | |
|---|---|---|---|
| 7,105,394 B2* | 9/2006 | Hachimine et al. | 438/197 |
| 7,763,509 B2* | 7/2010 | Pidin et al. | 438/199 |
| 2002/0061639 A1* | 5/2002 | Itonaga | 438/592 |

FOREIGN PATENT DOCUMENTS

| | | |
|---|---|---|
| JP | 09-289178 | 11/1997 |
| JP | 2002-184717 | 6/2002 |
| KR | 1020050122632 A | 12/2005 |

* cited by examiner

*Primary Examiner* — Quoc Hoang
(74) *Attorney, Agent, or Firm* — Myers Bigel Sibley & Sajovec, P.A.

(57) ABSTRACT

A method of fabricating a semiconductor integrated circuit (IC) device can include forming a first silicide layer on at least a portion of a transistor on a substrate, forming nitrogen in the first silicide layer to form a second silicide layer, forming a first stress layer having a tensile stress on the substrate having the transistor formed thereon, and irradiating the first stress layer with ultraviolet (UV) light to form a second stress layer having greater tensile stress than the first stress layer.

11 Claims, 6 Drawing Sheets

METHOD OF FABRICATING SEMICONDUCTOR INTEGRATED CIRCUIT DEVICE

CROSS-REFERENCE TO RELATED APPLICATION

This application claims priority from Korean Patent Application No. 10-2008-0134730 filed on Dec. 26, 2008, in the Korean Intellectual Property Office, and all the benefits accruing therefrom under 35 U.S.C. 119, the entire contents of which is incorporated herein by reference.

FIELD OF THE INVENTION

The present invention relates to a method of fabricating a semiconductor integrated circuit device.

BACKGROUND

In a metal-oxide-semiconductor field effect transistor (MOSFET), a gate electrode can be formed on a semiconductor substrate (insulated by a thin gate insulating layer) and a source/drain region can be formed on either side of the gate electrode. The MOS transistor can be controlled to form a channel region under the gate insulating layer by applying an appropriate bias voltage across the MOS transistor.

Attempts at improving the performance of semiconductor devices have been made by reducing the resistance of a cell by forming a silicide layer at an interface at which a contact will be formed and decreasing an interface resistance.

Other attempts have been made to increase the mobility of electrons or holes by applying a physical stress such as tensile stress or compressive stress and changing an energy band structure in a channel region.

SUMMARY

In some embodiments, a method of fabricating a semiconductor integrated circuit (IC) device includes forming a first silicide layer on at least a portion of a transistor on a substrate, forming nitrogen in the first silicide layer to form a second silicide layer, forming a first stress layer having a tensile stress on the substrate having the transistor formed thereon, and irradiating the first stress layer with ultraviolet (UV) light to form a second stress layer having greater tensile stress than the first stress layer.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Figure 1:
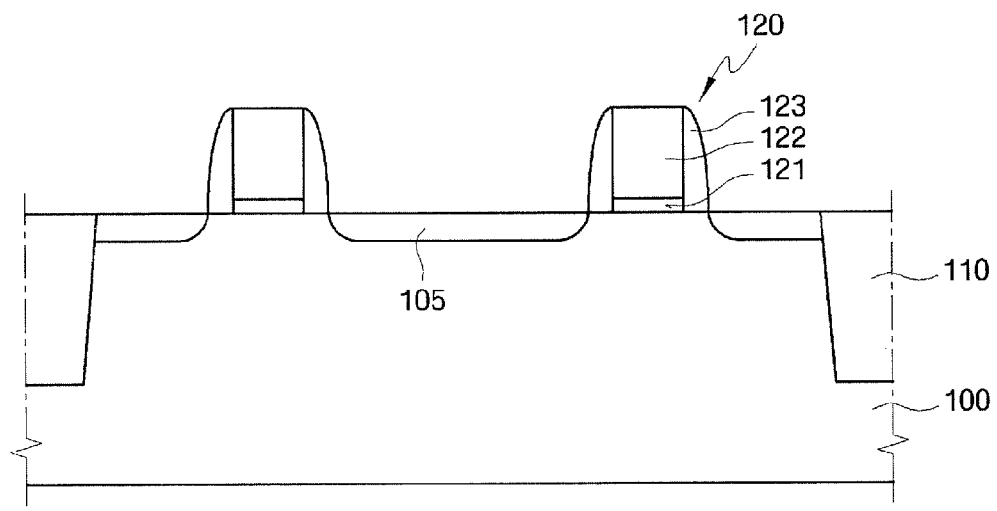
FIGS. 1 through 8 illustrate methods of fabricating a semiconductor integrated circuit (IC) device according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like numbers refer to like elements throughout.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

Exemplary embodiments of the invention are described herein with reference to cross-section illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Hereinafter, a method of fabricating a semiconductor IC device according to an embodiment of the present invention will now be described with reference to FIGS. 1 through 8.

Referring to FIG. 1, first, a substrate 100 is provided and a transistor 120 is formed on the substrate 100.

More specifically, a device isolation region 110 is formed on the substrate 100 to define an active region. For example, the substrate 100 may be a silicon substrate, Silicon On Insulator (SOI) substrate, and/or silicon germanium (SiGe) substrate. The device isolation region 110 may be formed by Shallow Trench Isolation (STI) or Field Oxide (FOX).

The transistor 120 has a gate insulating layer 121, a gate electrode 122 overlying the gate insulating layer 121, and a source/drain region 105 aligned on either side of the gate electrode 122. More specifically, an insulating layer for the gate insulating layer and a conductive layer for the gate electrode are sequentially deposited on the substrate 100 and patterned to form the gate insulating layer 121 and the gate electrode 122.

For example, the gate insulating layer 121 may be formed of silicon oxide ($SiO_x$), silicon oxynitride (SiON), titanium oxide ($TiO_x$), and tantalum oxide ($TaO_x$). The gate insulating layer 121 may be deposited by chemical vapor deposition (CVD), thermal oxidation, or sputtering.

The gate electrode 122 may be formed from a stack of at least one of polysilicon layer doped with n- or p-type impurities, metal layer, metal silicide layer, and metal nitride layer. For example, metal contained in the gate electrode 122 may be tungsten (W), cobalt (Co), nickel (Ni), titanium (Ti), or tantalum (Ta).

In this case, the transistor 120 further includes sidewall spacers 123 formed on sidewalls of the gate insulating layer 121 and gate electrode 122. The sidewall spacers 123 may be formed by forming a spacer layer (not shown) for the sidewall spacers 123 on the substrate 100 on which the gate insulating layer 121 and the gate electrode 122 have been formed and anisotropically etching the spacer layer. The sidewall spacer 123 may be formed of nitride or oxide.

The source/drain region 105 is self-aligned to the gate electrode 122. The source/drain region 105 may have a doubled diffused drain (DDD) or a lightly doped drain (LDD) structure. For example, the source/drain region 105 may have a double diffused drain (DDD) or lightly doped drain (LDD) structure. For example, forming an LDD type source/drain region 105 includes performing low concentration ion implantation using the gate electrode 122 as a mask, forming the sidewall spacers 123 along the sidewalls of the gate electrode 122, and implanting high concentration impurities into the substrate 100 using the sidewall spacers 123 as a mask to complete the source/drain region 105.

The transistor 120 is not limited to the shape shown in FIG. 1, and may have other various configurations.

Figure 2:
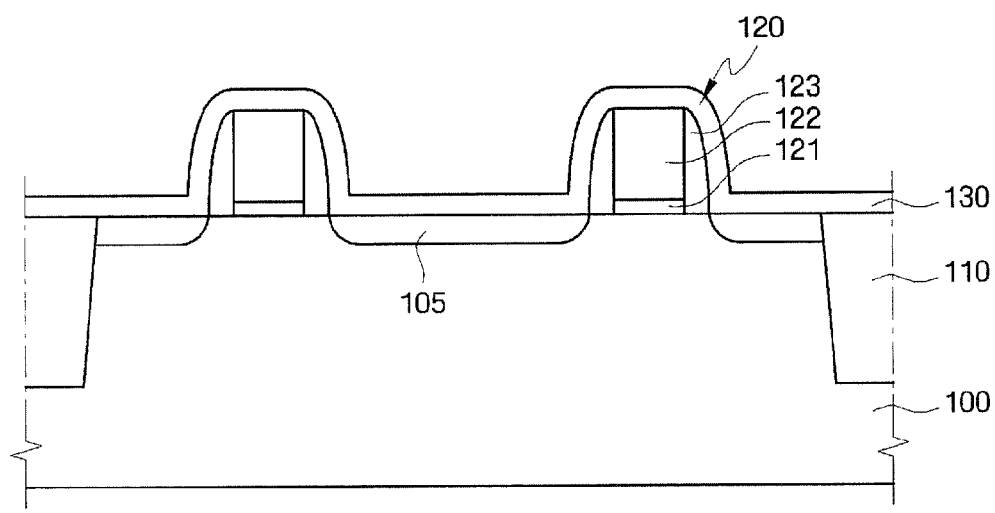

Referring to FIG. 2, a metal layer 130 for silicidation is then formed on the substrate 100 by Physical Vapor Deposition (PVD), CVD, or Atomic Layer Deposition (ALD). The metal layer 130 for silicidation may be formed of a low resistance metal containing at least one of Ni, Ti, platinum (Pt), palladium (Pd), Co, and W. The thickness of the metal layer 130 for silicidation also has to be determined considering the thickness of the underlying silicon consumed. For example, the metal layer 130 for silicidation may have a thickness sufficient not to completely consume its underlying source/drain region 105.

Figure 3:
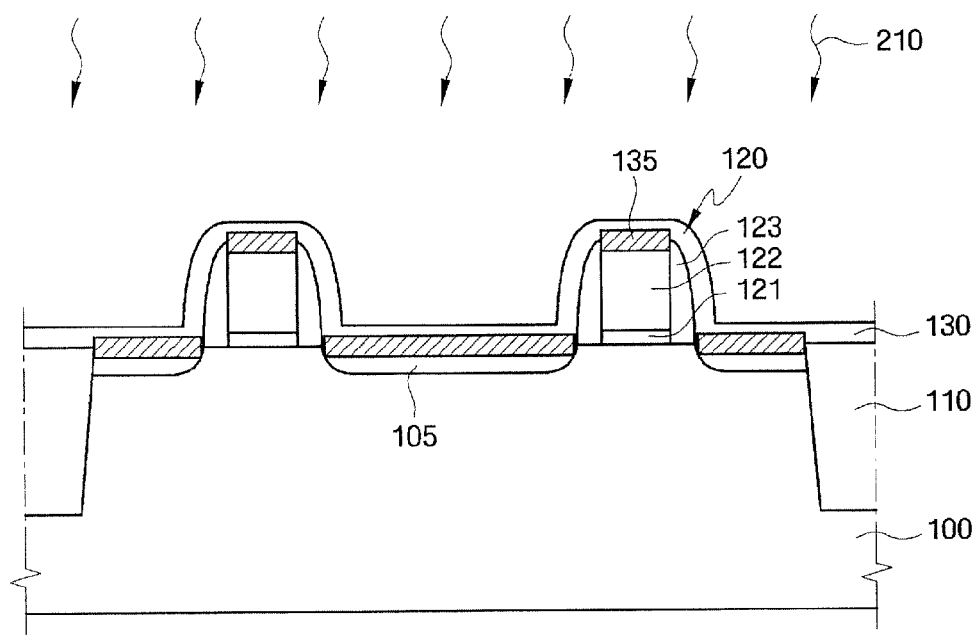

Referring to FIG. 3, a thermal process 210 is performed on the substrate 100 to form a first silicide layer 135 on a portion the transistor 120.

For example, the thermal process 210 may be performed using a rapid thermal process (RTP) apparatus or furnace. During the thermal process 210, a metal can react with a Si at an interface between the metal layer 130 for silicide and the Si, which is called silicidation reaction. Thus, the first silicide layer 135 is formed on the gate electrode 122 and the source/drain region 105 that contain Si and are in contact with the metal layer 130 for silicide. On the other hand, the first silicide layer 135 may not be formed on portions of the metal layer 130 for silicide that are not in contact with Si and overlie the sidewall spacers 123 and the device isolation region 110. The thermal process 210 may be performed using Rapid Thermal Annealing (RTA).

In this case, the first silicide layer 135 may be composed of a plurality of grains. That is, a metal reacts with Si to form silicide having a plurality of grains.

Figure 4:
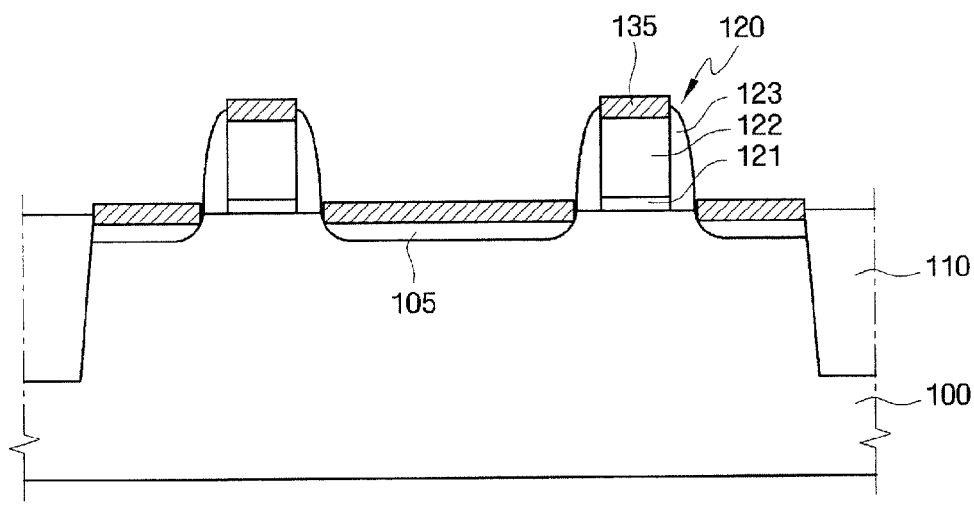

Referring to FIG. 4, the portions of the metal layer 130 for silicide that do not react with Si are removed by an etching or cleaning process. For example, the non-reacting metal layer 130 for silicide may be removed using a mixture of sulfuric acid and hydrogen peroxide. That is, the non-reacting metal layer 130 for silicide can be removed while a portion of the transistor 120, i.e., the first silicide layer 135 overlying the gate electrode 122 and the source/drain region 105, remains intact.

Figure 5:
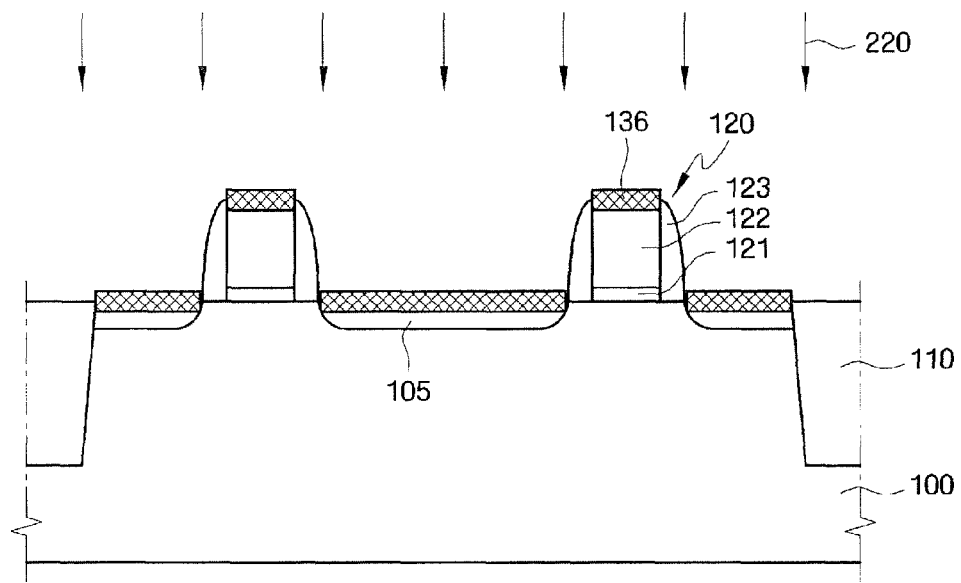

Referring to FIG. 5, nitrogen is thereafter implanted into the first silicide layer (135 in FIG. 4) to form a second silicide layer 136.

More specifically, during the nitrogen implantation into the first silicide layer 135, nitrogen plasma treatment 220 is performed on the substrate 100. $N_2$ or $NH_3$ can be used as a gas during the plasma treatment.

The second silicide layer 136 may contain nitrogen that separates grain boundaries between grains in the first silicide layer 135. That is, the first silicide layer 135 includes grains and the nitrogen introduced during the nitrogen plasma treatment 220 is incorporated into a boundary portion between each of the grains included in the first silicide layer 135 to separate the grain boundaries from each other.

Grain boundaries between the grains in the first silicide layer 135 can be separated by the nitrogen introduction. Thus, a large amount of energy may be needed for the plurality of grains to agglomerate. Thus, nitrogen injection may prevent agglomeration of adjacent silicide grains during a subsequent process. The second silicide layer 136 has a lower resistance than a silicide layer that undergoes agglomeration. Accordingly, a semiconductor IC device obtained by the manufacturing method according to the present invention provides improved reliability.

Here, separation of a grain boundary between grains means that induction of nitrogen into a space between two adjacent silicide grains, rather than physical separation by which a vacant space is created between the two grains.

Further, injecting the nitrogen into the first silicide layer 135 may include nitrogen annealing or nitrogen ion implantation for which $N_2$ or $NH_3$ can be used as a gas.

Figure 6:
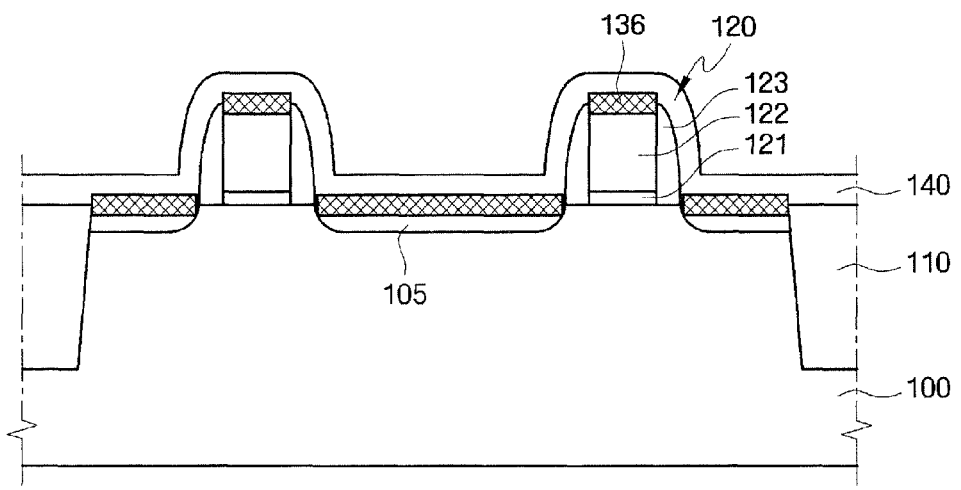

Referring to FIG. 6, a first stress layer 140 having tensile stress is formed on the substrate 100 having the transistor 120 formed thereon.

More specifically, the first stress layer 140 may be formed to cover the transistor 120 and the substrate 100. For example, the first stress layer 140 may be formed of silicon nitride (SiN) using CVD.

When the first stress layer 140 is formed of SiN, it can be determined whether a tensile stress or compressive stress is applied from the first stress layer 140 depending on the ratio of N—H bonds to Si—H bonds in the silicon nitride layer. For example, if the ratio of N—H bonds to Si—H bonds is about 1 to 5, a tensile stress is applied from the first stress layer 140. If the ratio is about 5 to 20, a compressive stress may be applied from the first stress layer 140.

In one embodiment, if the transistor 120 formed on the substrate 100 is a PMOS transistor, the first stress layer 140 may be formed to have tensile stress characteristics by adjusting process conditions for forming the first stress layer 140.

Figure 7:
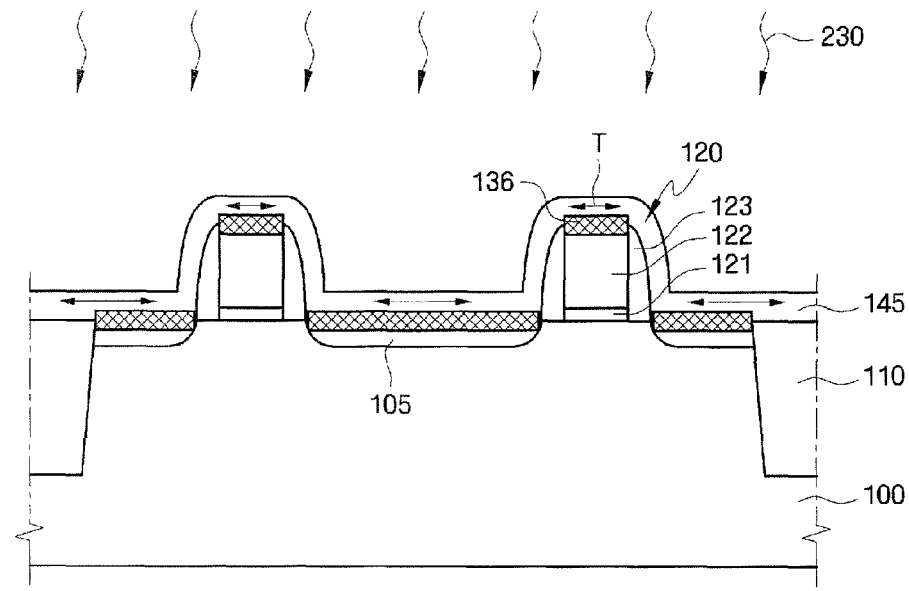

Referring to FIG. 7, the first stress layer (140 in FIG. 6) is then irradiated with ultraviolet (UV) light to form a second stress layer 145 having a higher tensile stress than the first stress layer 140.

Upon irradiation with the UV light 230, loose Si—H or N—H bonds in the first stress layer 140 can break. That is, hydrogen (H) is removed from the Si—H or N—H bond to form the second stress layer 145 that contracts more than the first stress layer 140. Thus, the second stress layer 145 can achieve higher tensile stress than the first stress layer 140. In this case, the UV light 230 may have a wavelength of about 200 to about 400 nm and Si—H or N—H bond may have a binding energy of about 3.5 to 4.0 eV. However, the present invention is not limited thereto.

Since the second silicide layer 136 has nitrogen introduced into a grain boundary as described above, the nitrogen can prevent agglomeration of silicide grains due to hydrogen generated in the first stress layer 140 upon irradiation with the UV light 230. Thus, an increase in the resistance of the second silicide layer 136 can be prevented.

Figure 8:
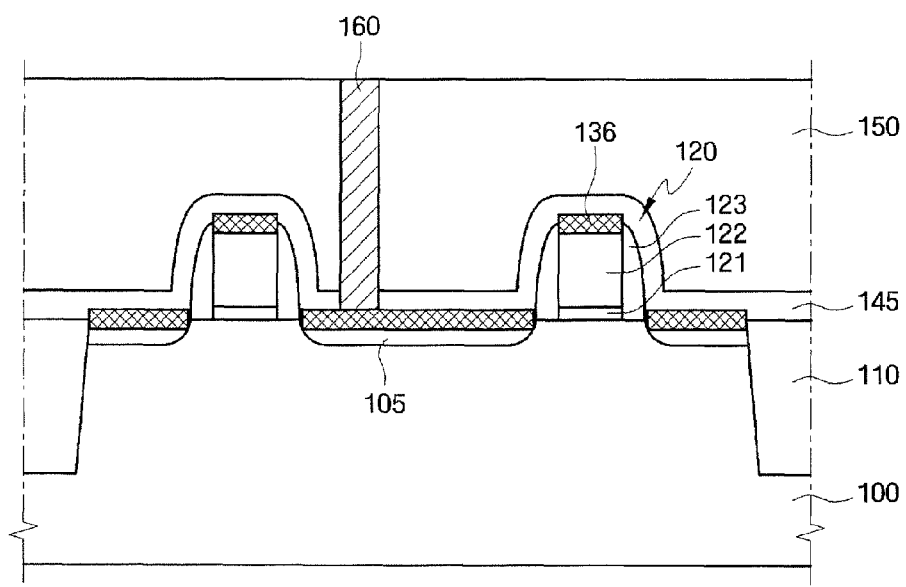

Referring to FIG. 8, an interlayer insulating layer 150 is formed on the substrate 100, followed by formation of a contact 160 penetrating the interlayer insulating layer 150 and existing on or within the second silicide layer 136.

The interlayer insulating layer 150 is formed of silicon oxide such as borosilicate glass (BSG), phosphosilicate glass (PSG), borophosphosilicate glass (BPSG) or undoped silicate glass (USG). In this case, the interlayer insulating layer 150 may be deposited by CVD or spin coating.

Although not shown in the drawings, after forming a photoresist pattern for forming a contact hole corresponding to the contact 160 on the interlayer insulating layer 150, the interlayer insulating layer 150 may be removed so as to expose the second silicide layer 136 using the photoresist pattern as an etch mask.

Subsequently, the contact hole is filled with a contact material to form the contact 160. During the filling of the contact hole, an ohmic layer and a diffusion barrier layer can also be formed sequentially and conformally along the contact hole to form a barrier layer.

Because agglomeration of grains in the second silicide layer 136 is reduced as described above, an increase in resistance of a portion between the contact 160 and the second silicide layer 136 can be prevented.

According to the method of fabricating a semiconductor IC device of the current embodiment, agglomeration of silicide grains that can occur upon irradiation of the first stress layer 140 with the UV light 230 can be prevented by injecting nitrogen into the first silicide layer 135. Thus, a manufacturing method according to the present invention can prevent an increase in the resistance of a silicide layer, thereby providing a semiconductor IC device with improved reliability.

Figure 9:
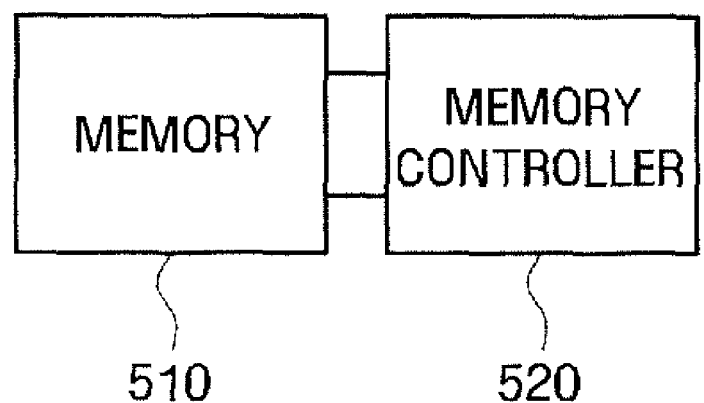
FIGS. 9 through 11 illustrate examples of using a semiconductor IC device provided by methods of manufacturing a semiconductor IC device according to embodiments of the present invention.
Figure 10:
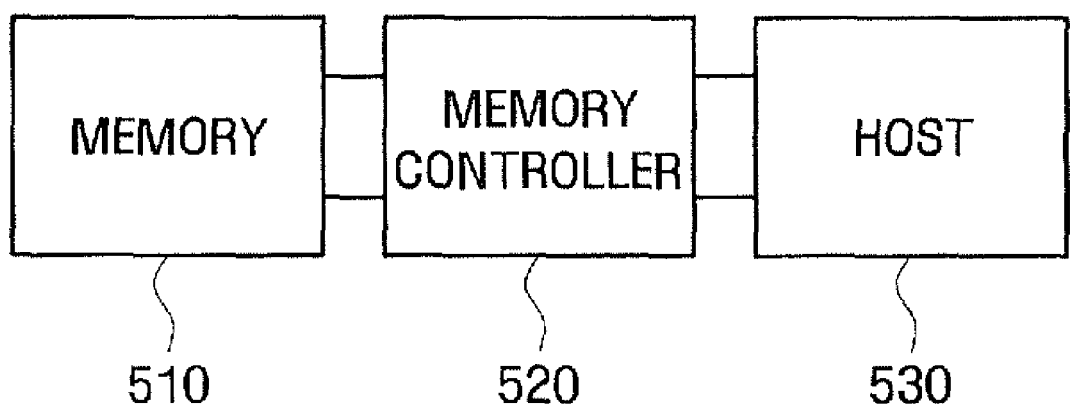
Figure 11:
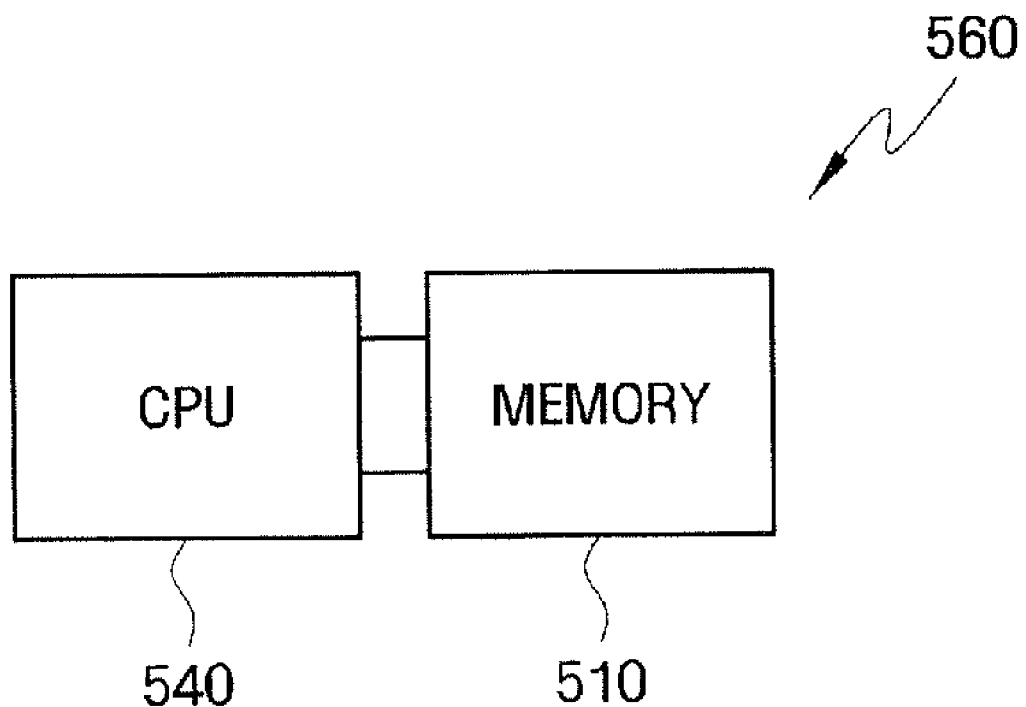

FIGS. 9 through 11 illustrate examples of using a semiconductor IC device provided by methods of manufacturing a semiconductor IC device according to embodiments of the present invention.

Referring to FIG. 9, a system according to an embodiment of the present invention includes a memory 510 and a memory controller 520 connected to the memory 510. The memory 510 is a semiconductor IC device manufactured according to the embodiments of the present invention. The memory controller 520 supplies an input signal for controlling the operation of the memory 510, such as an address signal and a command signal for controlling read and write operations, to the memory 510.

The system including the memory 510 and the memory controller 520 can be embodied in a card such as a memory card. More specifically, the system according to the current embodiment of the present invention can be implemented as a card that is designed for use in electronic devices and meets a predetermined industry standard. Examples of such electronic devices may include mobile phones, two-way communication systems, one way pagers, two-way pagers, personal communication systems, portable computers, Personal Data Assistances (PDAs), audio and/or video players, digital and/or video cameras, navigation systems, and Global Positioning Systems (GPSs).

However, the present invention is not limited thereto, and the system can be embodied in various other forms such as a memory stick.

Referring to FIG. 10, a system according to another embodiment of the present invention includes a memory 510, a memory controller 520, and a host system 530. In this case, the host system 530 is connected to the memory controller 520 via a bus and supplies a control signal to the memory controller 520 that in turn controls the operation of the memory 510. The host system 530 may be a processing system designed for use in mobile phones, two-way communication systems, one way pagers, two-way pagers, personal communication systems, portable computers, personal data assistances (PDAs), audio and/or video players, digital and/or video cameras, navigation systems, and global positioning systems (GPSs).

While FIG. 10 shows that the memory controller 520 is interposed between the memory 510 and the host system 530, the system is not limited thereto. The system may not include the memory controller 520.

Referring to FIG. 11, a system according to another embodiment of the present invention may be a computer system 560 including a central processing unit (CPU) 540 and a memory 510. In the computer system 560, the memory 510 is connected directly or via a bus architecture to the CPU 540. The memory 510 also stores operation system (OS) instruction sets, basic input/output start up (BIOS) instruction sets, and advanced configuration and power interface (ACPI) instruction sets. The memory 510 can be used as a large-capacity storage device such as a solid state disk (SSD).

Although FIG. 11 shows only some of the components in the computer system 560 for convenience of explanation, the computer system 560 may have various other configurations. For example, while FIG. 11 shows the computer system 560 does not include the memory controller (520 in FIG. 10) between the memory 510 and the CPU 540, in another embodiment, the memory controller 520 may be interposed between the memory 510 and the CPU 540.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor integrated circuit (IC) device comprising:
   forming a first silicide layer on at least a portion of a transistor on a substrate;
   forming nitrogen in the first silicide layer to form a second silicide layer;
   forming a first stress layer having a tensile stress on the substrate having the transistor formed thereon; and
   irradiating the first stress layer with ultraviolet (UV) light to form a second stress layer having greater tensile stress than the first stress layer, wherein hydrogen released from the first stress layer during the irradiating is prevented from agglomerating adjacent grains in the second silicide layer by the nitrogen introduced to the second silicide layer.

2. The method of claim 1, wherein forming the nitrogen in the first silicide layer comprises forming the nitrogen in the first silicide layer, wherein nitrogen plasma treatment, nitrogen annealing, or nitrogen ion implantation is performed on the substrate having the first silicide layer formed thereon.

3. The method of claim 2, wherein the nitrogen plasma treatment or nitrogen annealing is performed using $N_2$ gas or $NH_3$ gas.

4. The method of claim 1, wherein the first silicide layer includes a plurality of grains and the forming of the second silicide layer includes injecting the nitrogen into the first silicide layer to form a grain boundary between adjacent grains in the first silicide layer.

5. The method of claim 1, wherein the forming of the first stress layer includes forming a silicon nitride layer on the substrate having the transistor and the second silicide layer formed on the transistor.

6. The method of claim 1, wherein the transistor includes a gate insulating layer, a gate electrode overlying the gate insulating layer, and a source/drain region formed within the substrate and on either side of the gate electrode, and the forming of the first silicide layer on the portion of the transistor includes forming the first silicide layer on the gate electrode and the source/drain region.

7. The method of claim 1, wherein the first silicide layer contains at least one of nickel (Ni), titanium (Ti), platinum (Pt), palladium (Pd), cobalt (Co), and tungsten (W).

8. The method of claim 1, wherein the transistor is a p-type metal-oxide-semiconductor (PMOS) transistor.

9. The method of claim 1 wherein irradiating the first stress layer with UV light comprises irradiating the first stress layer with UV light having a wavelength between about 200 nm to about 400 nm.

10. The method of claim 9 wherein Si—H bonds or N—H bonds in the first stress layer have a binding energy between about 3.5 eV to about 4.0 eV.

11. The method of claim 10, after the forming of the second stress layer, the method further comprising:
    forming an interlayer insulating layer on the substrate and
        forming a contact penetrating the interlayer insulating layer and existing on or within the second silicide layer.

* * * * *